United States Patent [19]

Shiotsu et al.

[11] Patent Number: 5,480,585
[45] Date of Patent: Jan. 2, 1996

[54] STRIPPING LIQUID COMPOSITIONS

[75] Inventors: Shinichiro Shiotsu, Hyogo; Yoshiaki Horiuchi, Horiuchi, both of Japan

[73] Assignee: Nagase Electronic Chemicals, Ltd., Osaka, Japan

[21] Appl. No.: 430,604

[22] Filed: Apr. 28, 1995

Related U.S. Application Data

[63] Continuation of Ser. No. 107,159, Aug. 17, 1993, abandoned.

[30] Foreign Application Priority Data

Apr. 2, 1992 [JP] Japan ................... 4-109323

[51] Int. Cl.$^6$ .............. C11D 1/40; C11D 1/70; C11D 1/755; G03C 5/30
[52] U.S. Cl. ............ 252/544; 252/545; 252/548; 134/38; 430/329
[58] Field of Search .................... 252/544, 545, 252/548; 134/38; 430/329

[56] References Cited

U.S. PATENT DOCUMENTS

| | | | |
|---|---|---|---|
| 4,168,989 | 9/1979 | Edelman et al. | 134/28 |
| 4,765,844 | 8/1988 | Merrem et al. | 134/38 |
| 4,786,578 | 11/1988 | Neisius et al. | 430/256 |
| 4,844,832 | 7/1989 | Kobayashi et al. | 252/143 |
| 5,124,233 | 6/1992 | Meier et al. | 430/280 |
| 5,268,260 | 12/1993 | Bantu et al. | 430/325 |

Primary Examiner—Glennon H. Hollrah
Assistant Examiner—Deborah Lambkin
Attorney, Agent, or Firm—Jones, Tullar & Cooper

[57] ABSTRACT

A photoresist stripping liquid composition comprising an alkanol amine compound, a sulfone compound or sulfoxide compound, and a hydroxy compound. The composition is excellent in its photoresist stripping performance, safety and working efficiency, and does not cause corrosion on a substrate possessing a metal film.

6 Claims, No Drawings

STRIPPING LIQUID COMPOSITIONS

This is a continuation of application Ser. No. 08/107.159 filed on Aug. 17, 1993, now abandoned.

BACKGROUND OF THE INVENTION

The present invention relates to a novel stripping liquid composition for easily stripping off positive type photoresist film, negative type photoresist film, or the like formed on an inorganic substrate, without damaging the substrate.

In the manufacture of semiconductor integrated circuits or the device circuit of a liquid crystal panel, fine circuits are formed by applying a photoresist on a conductive metal film such as an Al alloy or an insulating film such as an oxide film formed on an inorganic substrate, exposing and developing the photoresist to form a pattern, and etching the metal or insulating film by using it as mask. Later, when the resist is not necessary, it is removed. As the stripping liquid for removing the resist, the combination of alkyl benzene and alkyl benzene sulfonic acid is widely employed.

As disclosed in the Japanese Laid-open Patent Sho. 64-42653, it is proposed to use alkaline organic solvents such as dimethyl sulfoxide, diethylene glycol monoalkyl ether, and organic hydroxy compounds containing nitrogen, or strong acids such as sulfuric acid and nitric acid.

The Japanese Laid-open Patent Sho. 62-49355 discloses a stripping liquid composition composed of ethylene oxide, an addition product of alkanol amine or polyalkylene polyamine, sulfone compound, and glycol monoalkyl ether.

However, in the combination of alkyl benzene and alkyl benzene sulfonic acid, corrosion is likely to occur, the rinsing process is complicated, and the stripping force is weak. When using the stripping liquid, or strong acids such as sulfuric acid and nitric acid disclosed in the Patent Sho. 64-42653, satisfactory results are not obtained in the stripping force or in corrosion resistance.

In the case of the stripping liquid composition disclosed in the Patent Sho. 62-49355, the stripping force is also weak.

Recently, as the processing size is becoming finer, the etching condition of the metal or the oxide film is becoming more sever the photoresist is heavily damaged, and the resist changes in quality. Accordingly, if treated by the above-mentioned organic solvent, the resist is left over on the substrate, and the stripping liquid composition with a powerful stripping force is demanded.

OBJECT AND SUMMARY OF THE INVENTION

The present invention solves the noted problems in the light of the background stated above, and it is a primary object thereof to provide a stripping liquid composition excellent in stripping performance, safety, and working efficiency, which does not cause corrosion on a substrate possessing a metal film.

To achieve the above object, the present invention provides a stripping liquid composition for stripping off a photoresist film applied on a substrate, comprising:

(a) an alkanol amine compound expressed by the structural formula $H_{3-n}N((CH_2)_mOH)_n$ (where m is 2 or 3, and n is 1, 2 or 3), (b) a sulfone compound or sulfoxide compound expressed by the structural formula $R_1$—$SO_2$—$R_2$ or $R_1$—$SO$—$R_2$ (where $R_1$ and $R_2$ are independently alkyl groups with 1 or 2 carbon atoms, or mutually coupled (bonded) and formed as cyclic alkylene groups with 4, 5 or 6 carbon atoms), and (c) a hydroxy compound expressed by the structural formula $C_6H_{6-n}(OH)_n$ (where n=1, 2 or 3) or $C_6H_{6-m-n}(OH)_nR_m$ (where n=1, 2 or 3, m=1 or 2, having at least a hydroxy group and at least a alkyl group or at least and alkoxy group added to a cyclic alkylene group).

In the present invention, the inorganic substrate includes silicon, silicon dioxide or gallium arsenic alone used in the panel for the semiconductor and the liquid crystal display, or conductive or insulating film such as aluminum, aluminum alloy, chromium, chromium oxide and nitride film formed on this substrate.

In the stripping liquid composition of the present invention, the alkanol amine compound is contained by 1 to 50 wt. %, preferably 20 to 40 wt. %, the sulfone compound or the sulfoxide compound by 99.5 to 40 wt. %, preferably 80 to 50 wt. %, and the hydroxy compound by 0.5 to 10 wt. %, preferably 2 to 6 wt. %.

It is also preferred to use monoethanol amine as the alkanol amine compound, tetramethylene sulfone as the sulfone compound, dimethyl sulfoxide as the sulfoxide compound, and dihydroxy benzene as the hydroxy compound.

In the stripping liquid composition of the present invention, the alkanol amine compound expressed by (a) the structural formula $H_{3-n}N((CH_2)_mOH)_n$ (where m is 2 or 3, and n is 1, 2 or 3) is contained in a range of 1 to 50 wt. %, preferably 20 to 40 wt. %.

Examples of the alkanol amine include monoethanol amine, diethanol amine, triethanol amine, monopropanol amine, dipropanol amine, tripropanol amine, and their mixtures. Among these alkanol amines, in particular, monoethanol amine is preferably used.

The stripping liquid composition of the present invention comprises, aside from the alkanol amine compound (a), a sulfone compound expressed by (b) the structural formula $R_1$—$SO_2$—$R_2$ (where $R_1$ and $R_2$ are respectively alkyl groups or an alkanol group with 1 or 2 carbon atoms, or a mutually coupled (bonded) and formed cyclic alkylene group with 4, 5 or 6 carbon atoms), or a sulfoxide compound expressed by the structural formula $R_1$—$SO$—$R_2$ (where $R_1$ and $R_2$ are respectively alkyl groups with 1 or 2 carbon atoms, or a mutually coupled (bonded) and formed cyclic alkylene group with 4, 5 or 6 carbon atoms).

Examples of the sulfone compound may include dimethyl sulfone, diethyl sulfone, bis(2-hydroxyethyl)sulfone, tetramethylene sulfone, and their mixtures.

As the sulfoxide compound, dimethyl sulfoxide DMSO) is used.

The stripping liquid composition of the present invention comprises, aside from the alkanol amine compound (a) and a sulfone compound or a sulfoxide compound (b), a hydroxy compound expressed by (c) the structural formula $C_6H_{6-n}(OH)_n$ (where n=1, 2 or 3) or $C_6H_{6-m-n}(OH)_nR_m$ (where n=1, 2 or 3, m=1 or 2, having at least a hydroxy group and at least a alkyl group or at least a alkoxy group added to a cyclic alkylene group).

Examples of the hydroxy compound may include phenol, cresol, methoxy phenol, ethyl phenol, allyl phenol, nonyl phenol, dihydroxy benzene, butyl catechol, trihydroxy benzene, and their mixtures, and in particular dihydroxy benzene (catechol) is preferably used.

A particularly preferred stripping liquid composition of the present invention comprises 30 wt. % of monoethanol amine, 60 wt. % of tetramethylene sulfone, and 10 wt. % of dihydroxy benzene, or 30 wt. % of monoethanol amine, 60 wt. % of dimethyl sulfoxide, and 10 wt. % of dihydroxy benzene.

The stripping liquid composition of the present invention, when a substrate possessing a photoresist, is immersed (dipped) in the stripping liquid composition usually at a temperature in a range of 40° to 120° C., is capable of dissolving and removing the photoresist. Afterwards, by cleaning (rinsing) the substrate in pure water and drying, a substrate having no residue is obtained. If necessary, however, before cleaning in pure water, it may be cleaned in a lower alcohol such as methanol and isopropyl alcohol, or ketones such as acetone and methylethylketone.

DETAILED DESCRIPTION OF THE PREFERRED EXAMPLES

Some of the preferred examples of the present invention are described in detail below.

COMPARATIVE EXAMPLES 1 to 4, EXAMPLES 1 to 6

Forming an Al alloy layer on a silicon wafer, an oxide film was formed on the Al alloy layer. The oxide film was patterned by using a commercial positive type photoresist. Then the oxide film was processed by a plasma etching treatment. The photoresist left over after this process was immersed (dipped) in the stripping liquid compositions specified in Table 1 for 10 minutes at the temperatures specified in Table 2, washed in isopropyl alcohol and in pure water, and dried by spinning. The substrate surface was observed by an electron microscope, and the presence or absence of a remaining photoresist film was investigated. In Table 1, MEA refers to monoethanol amine, BDG is butyl diglycol, DMSO is dimethyl sulfoxide, and catechol represents dihydroxy benzene. The unit of % is wt. %. In Table 2, the x-mark denotes the presence of residual photoresist film, and the o-mark indicates the absence of residual photoresist film.

TABLE 1

| | |
|---|---|
| Comparative Example 1 | MEA 30%, BDG 70% |
| Comparative Example 2 | MEA 30%, DMSO 70% |
| Comparative Example 3 | MEA 30%, Dimethyl sulfone 70% |
| Comparative Example 4 | MEA 30%, Dimethyl sulfone 10%, BDG 60% |
| Example 1 | MEA 30%, DMSO 60%, Catechol 10% |
| Example 2 | MEA 30%, Dimethyl sulfone 60%, Catechol 10% |
| Example 3 | MEA 30%, Dimethyl sulfone 10%, BDG 50%, Catechol 10% |
| Example 4 | MEA 30%, DMSO 60%, Phenol 10% |
| Example 5 | MEA 30%, DMSO 60%, Nonyl phenol 10% |
| Example 6 | MEA 30%, DMSO 70%, Methoxy phenol 10% |

TABLE 2

| | Treating temperature (°C.) | | |
|---|---|---|---|
| | 80 | 100 | 120 |
| Comparative Example 1 | x | x | x |
| Comparative Example 2 | x | x | x |
| Comparative Example 3 | x | x | x |
| Comparative Example 4 | x | x | x |
| Example 1 | x | o | o |
| Example 2 | x | o | o |
| Example 3 | x | x | o |
| Example 4 | x | o | o |
| Example 5 | x | x | o |
| Example 6 | x | o | o |

COMPARATIVE EXAMPLES 5 to 9, EXAMPLES 7 to 12

Forming an Al alloy layer on a silicon wafer, it was patterned by using a commercial positive type photoresist. The Al alloy layer was processed by a plasma etching treatment, and the photoresist left over after this process was immersed in the stripping liquid compositions shown in Table 3 for 10 minutes at the temperatures shown in Table 4, then washed in isopropyl alcohol and in pure water, and dried by spinning. The substrate surface was observed by an electron microscope, and the presence or absence of a remaining photoresist film was investigated. In the specimen treated at 100° C., moreover, the thickness of the Al alloy layer was measured, and the thickness of the portion that had not been etched was measured by a film thickness tester and compared with the initial thickness in order to investigate corrosion by the stripping liquid compositions. In Table 4, the x-mark indicates the presence of residual photoresist film, and the o-mark in the column of treating temperature denotes the absence of a residual photoresist film. The o-mark in the column of Al corrosiveness indicates the absence of corrosion. Specifically it means the loss is 100 Å or less as compared with the initial thickness.

TABLE 3

| | |
|---|---|
| Comparative Example 5 | MEA 30%, BDG 70% |
| Comparative Example 6 | MEA 30%, DMSO 70% |
| Comparative Example 7 | MEA 30%, Dimethyl sulfone 70% |
| Comparative Example 8 | MEA 30%, Dimethyl sulfone 10%, BDG 60% |
| Comparative Example 9 | MEA 30%, BDG 60%, Catechol 10% |
| Comparative Example 10 | MEA 30%, BDG 60%, Catechol 10% |
| Example 7 | MEA 30%, DMSO 60%, Catechol 10% |
| Example 8 | MEA 30%, Dimethyl sulfone 60%, Catechol 10% |
| Example 9 | MEA 30%, DMSO 60%, Phenol 10% |
| Example 10 | MEA 30%, DMSO 60%, Nonyl phenol 10% |
| Example 11 | MEA 30%, DMSO 60%, Methoxy phenol 10% |
| Example 12 | MEA 30%, Tetramethylene sulfone 60%, Catechol 10% |
| Example 13 | MEA 30%, Tetramethylene sulfone 60%, Catechol 10% |

TABLE 4

| | Treating temperature (°C.) | | | Al corrosiveness |
|---|---|---|---|---|
| | 80 | 100 | 120 | |
| Comparative Example 5 | x | x | x | o |
| Comparative Example 6 | x | x | o | o |
| Comparative Example 7 | x | x | o | o |

TABLE 4-continued

| | Treating temperature (°C.) | | | |
| --- | --- | --- | --- | --- |
| | 80 | 100 | 120 | Al corrosiveness |
| Comparative Example 8 | x | x | o | o |
| Comparative Example 9 | x | x | o | |
| Comparative Example 10 | x | x | o | o |
| Example 8 | x | x | o | o |
| Example 7 | o | o | o | o |
| Example 8 | o | o | o | o |
| Example 9 | x | o | o | o |
| Example 10 | x | o | o | o |
| Example 11 | x | o | o | o |
| Example 12 | o | o | o | o |

Thus, the stripping liquid composition of the present invention comprises an alkanol amine compound, a sulfone compound or sulfoxide compound, and a hydroxy compound, and is excellent in safety and working efficiency, superior in stripping performance of photoresist owing to the synergistic effects of these components, and hence particularly capable of removing the photoresist film degenerated (changed in quality) by the processing such as plasma etching, RIE (reactive ion etching) process, ion implantation process, or the like on the substrate which was difficult in the prior art, promptly and easily by relatively low temperature treatment. Moreover, it does not induce corrosion on a substrate possessing a metal film.

Having described preferred examples of the present invention, it is to be understood that the present invention is not limited to those precise examples, and that various changes and modifications may be effected therein by one skilled in the art without departing from the scope or spirit of the present invention as defined in the appended claims.

What is claimed is:

1. A stripping liquid composition for stripping off a photoresist film applied on a substrate, comprising:

(a) an alkanol amine compound expressed by the structural formula $H_{3-n}N((CH_2)_mOH)_n$ (where m is 2 or 3, and n is 1, 2 or 3), (b) a sulfone compound or sulfoxide compound expressed by the structural formula $R_1-SO_2-R_2$ or $R_1-SO-R_2$ (where R1 and R2 are independently alkyl groups with 1 or 2 carbon atoms, or mutually coupled and formed cyclic alkylene groups with 4, 5 or 6 carbon atoms), and (c) a hydroxy compound expressed by the structural formula $C_6H_{6-n}(OH)_n$ (where n=1, 2 or 3) or $C_6H_{6-m-n}(OH)_nR_m$ (where n=1, 2, or 3, m=1 or 2, having at least a hydroxy group and at least an alkyl group or at least an alkoxy group added to a cyclic alkylene group), wherein the ratio of the ingredients (a)–(c) is in the proportion of 3:6:1.

2. A stripping liquid composition of claim 1, wherein the alkanol amine compound is monoethanol amine.

3. A stripping liquid composition of claim 1, wherein the sulfone compound is tetramethylene sulfone.

4. A stripping liquid composition of claim 1, wherein the sulfoxide compound is dimethyl sulfoxide.

5. A stripping liquid composition of claim 1, wherein the hydroxy compound is dihydroxy benzene.

6. A method of stripping off a photoresist film on a substrate using a composition comprising: (a) an alkanol amine compound expressed by the structural formula $H_{3-n}N((CH_2)_mOH)_n$ (where m is 2 or 3, and n is 1, 2 or 3), (b) a sulfone compound or sulfoxide compound expressed by the structural formula $R_1-SO_2-R_2$ or $R_1-SO-R_2$ (where R1 and R2 are independently alkyl groups with 1 or 2 carbon atoms, or mutually coupled and formed cyclic alkylene groups with 4, 5 or 6 carbon atoms), and (c) a hydroxy compound expressed by the structural formula $C_6H_{6-n}(OH)_n$ (where n=1, 2 or 3) or $C_6H_{6-m-n}(OH)_nR_m$ (where n=1, 2 or 3, m=1 or 2, having at least a hydroxy group and at least an alkyl group or at least an alkoxy group added to a cyclic alkylene group), wherein the ratio of the ingredients (a)–(c) is in the proportion of 3:6:1, comprising the step of:

applying the composition (a)–(c) to the photoresist film subsequent to etching of the photoresist film.

* * * * *